(12) United States Patent
Buchanan et al.

(10) Patent No.: US 6,611,217 B2
(45) Date of Patent: Aug. 26, 2003

(54) INITIALIZATION SYSTEM FOR RECOVERING BITS AND GROUP OF BITS FROM A COMMUNICATIONS CHANNEL

(75) Inventors: Brian Buchanan, Overland Park, KS (US); John Marshall, Cary, NC (US); Christopher G. Riedle, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/150,337

(22) Filed: May 17, 2002

(65) Prior Publication Data

US 2003/0048209 A1 Mar. 13, 2003

Related U.S. Application Data

(62) Division of application No. 09/330,713, filed on Jun. 11, 1999, now Pat. No. 6,430,242.

(51) Int. Cl.[7] .............................................. H03M 9/00
(52) U.S. Cl. ...................................... 341/100; 341/101
(58) Field of Search ............................... 341/100, 101; 326/38, 63; 375/354, 356

(56) References Cited

U.S. PATENT DOCUMENTS

| | | | |
|---|---|---|---|
| 4,800,564 A | 1/1989 | DeFrazio et al. | 714/814 |
| 4,811,364 A * | 3/1989 | Sager et al. | 375/354 |
| 5,081,654 A | 1/1992 | Stephenson, Jr. et al. | 375/106 |
| 5,157,530 A | 10/1992 | Leob et al. | 359/124 |
| 5,400,370 A | 3/1995 | Guo | 375/118 |
| 5,533,072 A | 7/1996 | Georgiou et al. | 375/371 |
| 5,568,302 A | 10/1996 | Puzey | 359/157 |
| 5,568,526 A * | 10/1996 | Ferraiolo et al. | 375/356 |
| 5,587,709 A | 12/1996 | Jeong | 341/100 |
| 5,651,033 A | 7/1997 | Gregg et al. | 375/354 |
| 5,675,584 A | 10/1997 | Jeong | 370/284 |
| 5,675,617 A | 10/1997 | Quirk et al. | 375/365 |
| 5,714,904 A | 2/1998 | Jeong | 327/407 |
| 6,005,412 A * | 12/1999 | Ranjan et al. | 326/63 |
| 6,222,380 B1 * | 4/2001 | Gerowitz et al. | 326/38 |
| 6,430,242 B1 * | 8/2002 | Buchanan et al. | 375/371 |

* cited by examiner

*Primary Examiner*—Jean Bruner Jeanglaude
(74) *Attorney, Agent, or Firm*—Carlos Munoz-Bustamante; Joscelyn B. Cockburn; Winstead, Sechrest & Minick, P.C.

(57) ABSTRACT

A system normally converts a parallel data word to a single serial data stream to use a high speed serial link. The parallel data word is partitioned into N sub-sets or nibbles and each nibble is then serialized and transmitted over N serial links using high speed differential drivers. Each of the N serialized nibbles are received in a differential receiver. The serialized nibbles are then coverted back into N parallel nibbles and the N parallel nibbles are then assembled back to the original parallel data word. To increase reliability, the received data is coupled to a tapped delay element having M stages of delay. A training sequence and algorithm are used to determine which of the taps of the delay element are a desired delay distance away from data transitions. These taps are then used to sample the incoming signals to reconstruct the parallel data word.

6 Claims, 13 Drawing Sheets

INITIALIZATION SYSTEM FOR RECOVERING BITS AND GROUP OF BITS FROM A COMMUNICATIONS CHANNEL

CROSS-REFERENCE TO RELATED PATENT APPLICATIONS

This divisional application claims priority of application Ser. No. 09/330,713, filed Jun. 11, 1999, U.S. Pat. No. 6,430,242.

The listed related patent applications are incorporated herein by reference:

(Ser. No. 09/330,968), entitled: High Speed Parallel/Serial Link for Data Communication;

(Ser. No. 09/330,735), entitled: System that Compensates for Variances Due to Process and Temperature Changes;

(Ser. No. 09/330,743), entitled: Data Alignment Compensator;

(Ser. No. 09/330,971), entitled: Low Power Differential Driver.

Background of the Invention

1. Field of the Invention

The present invention relates to communications network in general and, in particular, to systems for interconnecting electrical sub-systems such as modules, ASIC, etc.

2. Prior Art

The proliferation of computers and related electrical machines, such as routers, switches, servers, etc., have created a need for improved interconnection devices and methods. The need is present not only at the box level, but also at the sub-assembly level. The box level relates to interconnecting standalone boxes, such as workstations, personal computers, servers, routers, etc., whereas the sub-assembly level relates to components such as ASICS, modules, etc., within the boxes.

Traditionally two interconnecting approaches or techniques have been used. In one technique, a bus structure does the interconnection. Even though bus structure transfers data relatively fast, it is expensive and requires multiple pins (one for each bit) at the interface. There are many designs in which pin counts and cost are very sensitive issues. As a consequence, bus structures are not suitable for interconnecting sub-assemblies.

In the other approach, a serial link is used as the interconnecting mechanism. Even though the serial links solve some of the problems associated with the bus structures, they too have shortcomings which limit their use. Probably, the most severe of all the shortcomings is that the serial links are relatively low speed. For example, an RS232 serial link transmits data at approximately 115K bits/sec. Surely, this speed makes them unsuitable for use in high speed, say 500 and greater Mbps, applications.

The prior art has provided serial link devices with speed greater than RS232, albeit less than 500 Mbps. Even though these systems point in the right direction, they suffer several defects including unnecessary use of pins to transmit clock signal, etc.

Examples of the prior art systems are set forth in the following U.S. Pat. Nos.:

5,081,654
5,651,033
5,533,072
5,587,709
5,675,584
5,714,904

In view of the above, there is a need for a more efficient high speed interconnection system.

SUMMARY OF THE INVENTION

The interconnection system of the present invention is termed Data Aligned Serial Link (DASL) Interface. The DASL Interface receives data from a parallel interface such as a CMOS ASIC, partitions the bits from the parallel interface into a smaller number of parallel bit streams. The smaller number of parallel bit streams are then converted into a high speed serial stream, which is transported via a transmission medium to the receiver of the other module. A differential driver with control impedance drives the serial bit stream of data into the transmission media.

By simultaneously transmitting groups of bit streams serially over different transmission media, a high speed, high volume data path is provided. The data path uses fewer pins and transfers data at a faster rate than a traditional bus structure.

Prior to sending actual data, the system is initialized with a training procedure that sends a training pattern from the transmitter on one module to the receiver on the remote module. Preferably, the training pattern includes a 32-bit transmission rich sequence of 7 hex "A" patterns (1010) and 1 hex "5" pattern (0101). The purpose of the training pattern is to provide sufficient pattern edges so the receiver, through its algorithm, can acquire bit synchronization and then nibble synchronization to establish the most and least significant bits in the serial data stream when the bit stream is converted back into a 4-bit nibble.

The received data from each transmission medium is processed separately. The receiver converts the data into a single ended signal which is delayed over-sampled and latched. A controller examines the captured over-sampled data to determine wherein the series of latched positions data transition occur.

This is done to determine two sample points in the stream of oversampled data with the highest probability of uncorrupted data. The oversampled data which has the least probability of data error is the oversampled data contained in the latches farthest away from the data transitions. This is because all high speed systems have data jitter in the form of the system clock jitter, data intersymbol and transmission media distortions as well as system crosstalk that make the sample around data transitions uncertain as to data integrity. By averaging of the positions determined to have transitioning data, the controller then determines which of the latched data to be used for the serial data samples. The sample points are selected by taking the locations of the data latches where data transitions occur, subtract the location numbers and add half the difference to the smaller location (done for two sequential data bits, giving two strobe positions). The controller acts as a digital software filter though this process by accumulating and averaging transition information and supplying the result of the accumulated data. This is important in that the best sample point is the point based upon the average points of transition, so as the sample does not respond to one piece of jitter, readjust its sample point and then sample the next bit in a location where the data integrity is uncertain. When actual data is sent in place of the training pattern, the sampled data will contain long run lengths where no transitions are present. When this occurs, no update in the algorithm sample point will occur.

Once the data stream has been adjusted for the best sample points, the two selected data streams are then fed into a series of latches and passed through two multiplexers (FIG. 8, MUX46, MUX52). Access of the output nibble is provided to the controller for adjusting the bits into their proper parallel order. The output nibble bit order is adjusted by the controller through manipulations of the control inputs to MUX46 and MUX52.

To reconstruct the 4 bit nibble into its correct parallel order, an initial training pattern is suppled to the receiver, supplying a repeating pattern into the receiver with a unique end bit (7 "A's", followed by a "5"). Adjustment of the bit order is performed by the controller which compares the serial string against a lookup template and through its various software states, adjust the nibble bit position.

DETAILED DESCRIPTION OF THE PREFERRED EMBODIMENT

Figure 1:
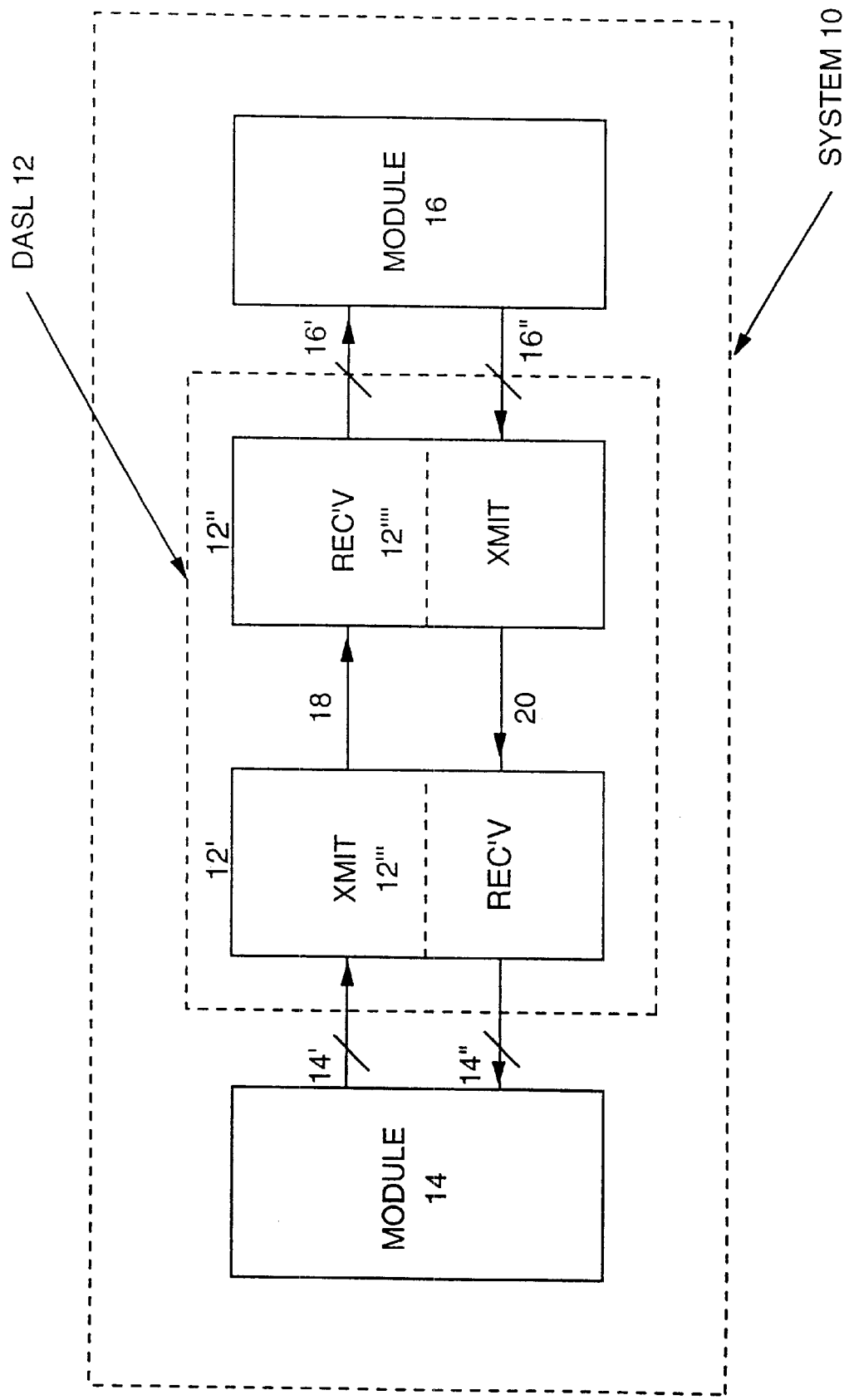
FIG. 1 shows a block diagram of a system according to the teachings of the present invention.

FIG. 1 shows a block diagram of the System 10 embodying the teachings of the present invention. The System 10 includes Module 14 and Module 16 interconnected by the Data Align Serial Link (DASL) Interface 12. The System 10 could be a subsystem of the larger system fabricated on a motherboard. The DASL Interface 12 provides high speed communication between Module 14 and Module 16. The modules may be CMOS ASIC or any other of the well known process related Large Scale Integration (LSI) chip. Each of the modules is connected by input and output bus respectively to the DASL Interface 12. The angled line crossing a horizontal line indicates a bus structure throughout the figures of this document.

The DASL Interface 12 includes two identical sections labelled 12' and 12", respectively. Each of the sections is connected by busses to one of the modules. To this end, Section 12' is connected by Bus 14' and 14", respectively. The direction of signal flow in Bus 14' and Bus 14" is indicated by the arrow. Similarly, Section 12" is connected by Bus 16' and 16" to Module 16. Section 12' and Section 12" are connected by High Speed Serial Link 18 and High Speed Serial Link 20. The direction of signal flow in the high speed data links are shown by the direction of the arrows.

Still referring to FIG. 1, each section of DASL Interface 12 includes a transmitter (XMIT) and a receiver (REC'V). The transmitter and receiver in the sections are identical. Therefore, for purposes of description, a transmitter and receiver interconnected by a high speed serial link will be described. It being understood that the details of the transmitter and receiver are similar to the transmitter and receiver in the non-described section. With this nomenclature, Transmitter 12''' receives parallel signals on Bus 14' from Module 14, generates a high speed serial data stream that is outputted on Transmission Media 18 and is received in Receiver 12''''. Receiver 12'''' receives the serial data, reconstructs it to output a parallel stream of data on Bus 16' to Module 16. The Transmission Media 18 could be a microstrip or strip line trace on printed circuit card, a controlled impedance cable or similar transmission medium. It should also be noted that several serial links such as 18 carrying high speed serial data can be grouped together to provide a transmission group for a multi-bit port. In this configuration, a hybrid high speed bus structure is provided.

Figure 2:
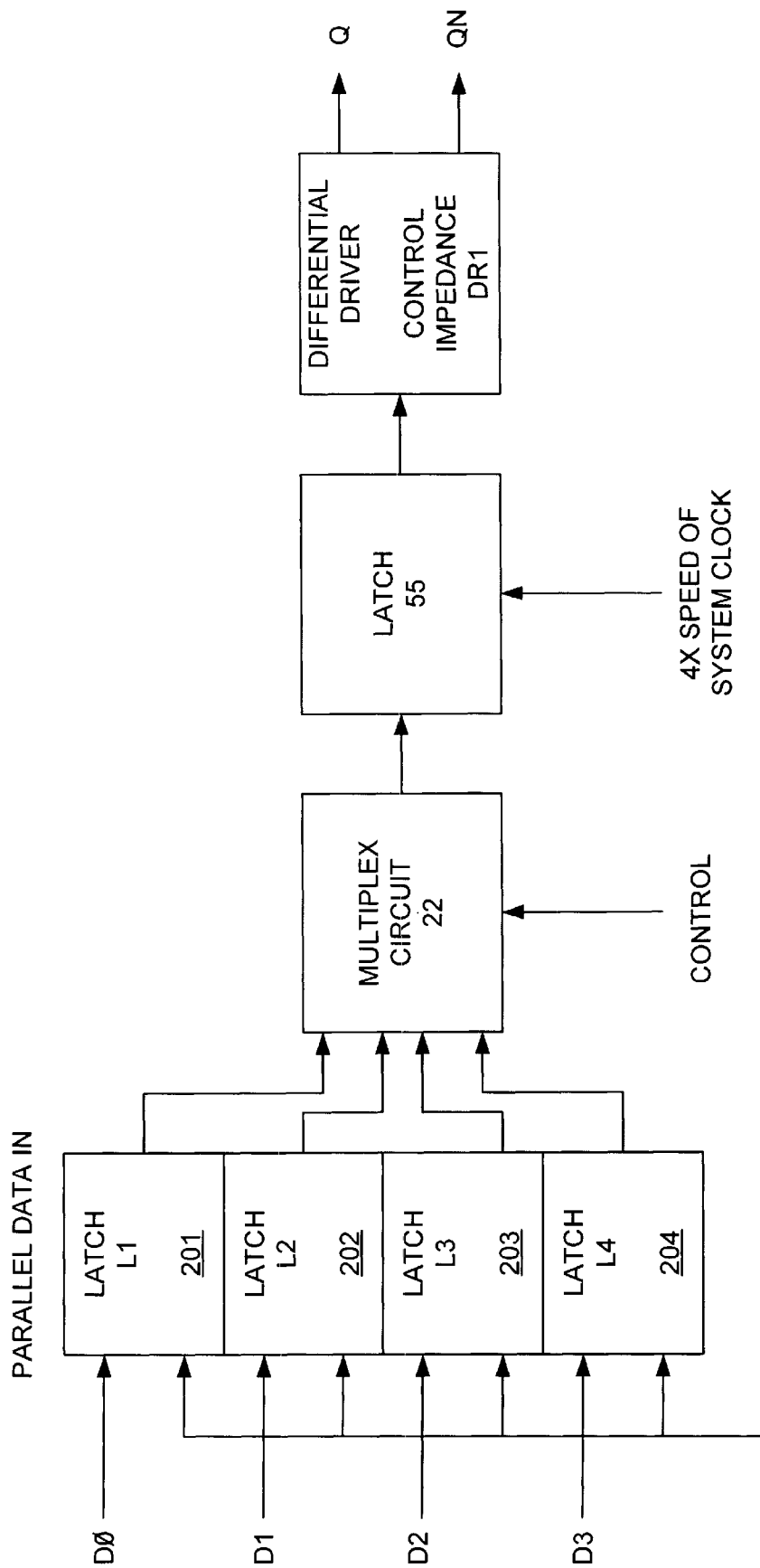
FIG. 2 shows a block diagram of the transmit section (transmitter) of the Data Aligned Serial Link (DASL) Interface.

FIG. 2 shows a block diagram of the transmitter. The transmitter includes N latches labeled L1 201, L2 202, L3 203 and L4 204. The output from each latch is connected to Multiplex Circuit 22. The multiplex circuit is driven by a control signal on a line labeled Control. The output from Multiplex Circuit 22 is connected to Latch L5. The output from Latch L5 is connected to differential driver DR1 with Control Impedance. The differential driver generates a Differential Signal Q and QN. As will be explained subsequently, it is the differential signal that is transmitted through the transmission line or other media to the receiver.

Still referring to FIG. 2, Parallel Data Streams D0–D3 are presented to the input of the Latches L1 201–L4 204. A system clock signal is also provided to each one of the latches. As stated previously, the interface from the module to the DASL is a parallel interface. Usually, the number of bits in the parallel interface is on a byte (8-bit) boundary. According to the present invention, it is more advantageous to partition the bits into nibbles for processing and sending through the serial link. In one embodiment of the present invention, 16-bit parallel data streams are supplied to DASL interface. The bit streams are partitioned into four groups of four bits (4 bits=1 nibble) streams. Each of the nibbles is processed according to the teaching of the present invention and is sent over a serial link. As a consequence, to transmit the 16-bit, four serial links would be required. Each nibble of data is processed in the same way; therefore, the description of one (set forth hereinafter) is intended to cover the processing of the others. The four parallel data bit streams are transformed into a high-speed serial bit stream by latching each of the four bit streams in one of the Latch L1 201 through L4 204 and sequentially strobing the last information at four times the parallel clock rate using Multiplexer Circuit 22. The data stream is then reshaped by serial Latch L5, which is clocked also at four times the parallel clock rate and sent into a low power Differential Driver DR1.

Still referring to FIG. 2, Differential Driver DR1 (described below) provides differential signals to the output of the module with sufficient voltage swing to force a high peak-to-peak resulting in low bit error rate. The Driver DR1 also impedance matches the control impedance of the microstrip circuit card lines which it drives to minimize transmission line reflections that would otherwise occur if the driver was mismatched to these printed circuit card lines or transmission cable. The signal is then received by a receiver on the other module which converts the serial bit stream back to logic levels.

Figure 2A:
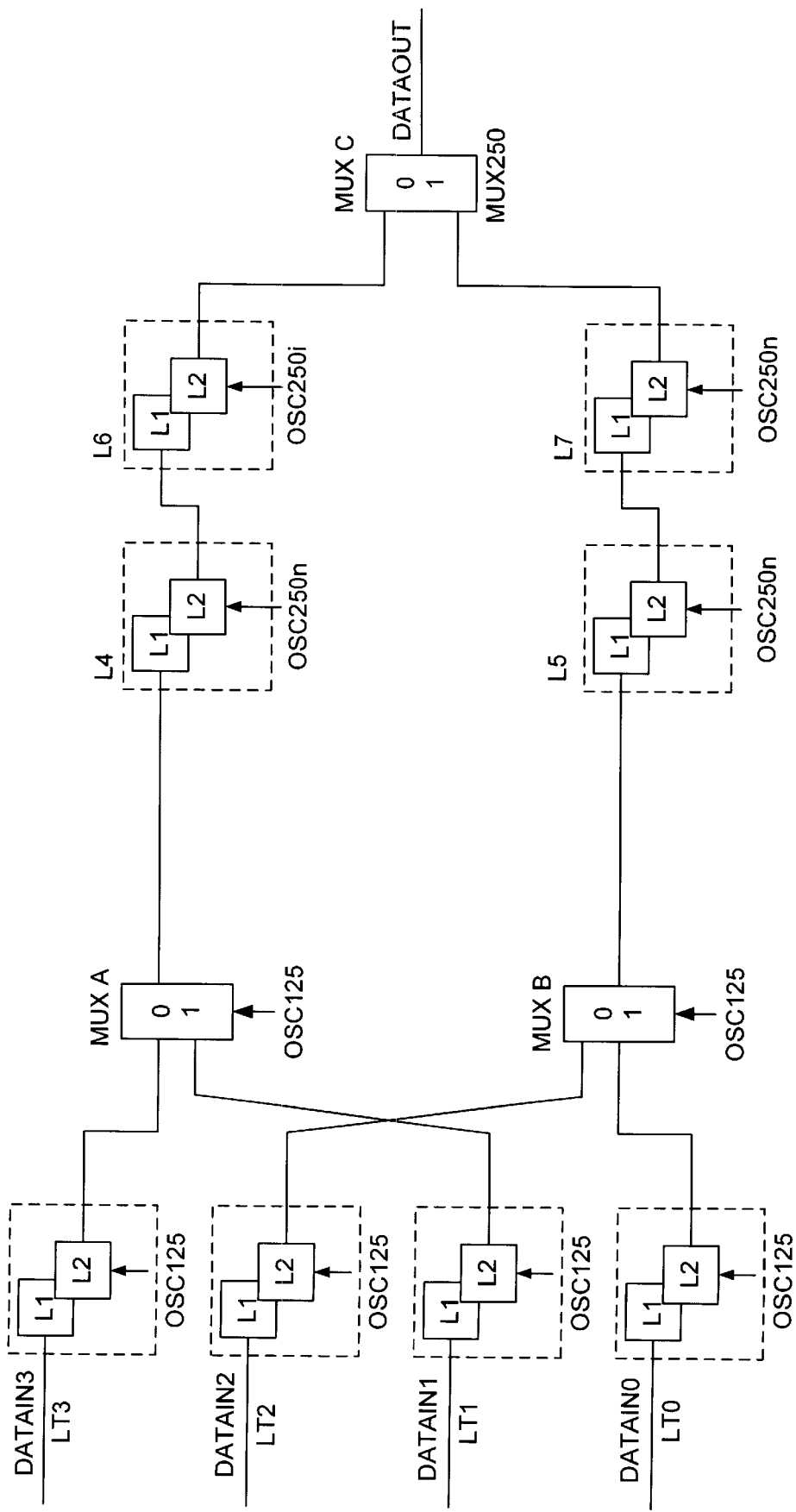
FIG. 2A shows a block diagram of another embodiment of the transmitter according to the teachings of the present invention.

FIG. 2A shows another embodiment of the transmitter circuit. As stated previously, the function of the transmitter circuit is to serialize nibbles of data onto separate serial streams that are transmitted on separate serial links. The nibbles of data is selected from parallel bit streams. Four latches labeled LT0, LT1 LT2, and LT3 receive data labeled DATAIN0, DATAIN1, DATAIN2 and DATAIN3. The data are from parallel bit streams. Each of the latches comprises of two latches labeled L1 and L2. In this configuration, L1 captures data while L2 is used for launching data. The clock signal to each latch is labeled OSC 125. The 125 indicates that the clock is a 125 nanosecond clock. The output from latch LT3 and latch LT1 is connected to Multiplexer A (MUXA). Likewise, the output from LT2 and LT0 are connected to MUXB. MUXA and MUXB are driven by 125 nanosecond clock labeled OSC 125. The output from MUXA is connected to latch L4 which is driven by a clock labeled OSC 250N. The output from L4 is connected to L6 which is driven by an inverted clock labeled OSC 250i. The output from L6 is connected to MUXC. The output from MUXB is connected to L5, which is driven by a clock labeled OSC 250N. The output from L5 is connected to L7, which is driven by a clock labeled OSC 250N. The output from L7 is connected to MUXC, which is driven by a clock labeled MUX 250. The output from MUXC is connected to the driver circuit DR1 previously discussed, but not shown in FIG. 2A. The numerals 125 and 250 relate to clock speeds. In addition, the above description relates to one nibble and would be repeated for multiple nibbles. For example, a sixteen bit wide interface would require four of the above described circuits. An eight bit interface requires two, and a thirty-two bit interface requires eight and so forth.

Still referring to FIG. 2A, the latches LT0, LT1, LT2 and LT3 are driven by 125 nanosecond clock labeled OSC 125. MUXA and MUXB are driven by a clock labeled OS 125. This clock is similar to the one used to drive latches LT0 through LT3. With respect to MUXA and MUXB, when the clock phase is 0, the LT3 latch is passed through MUXA and the LT2 latch passes through MUXB. When the clock phase is a 1, data from latch LT1 passes through MUXA and the data from latch LT0 passes through MUXB.

Figure 2B:
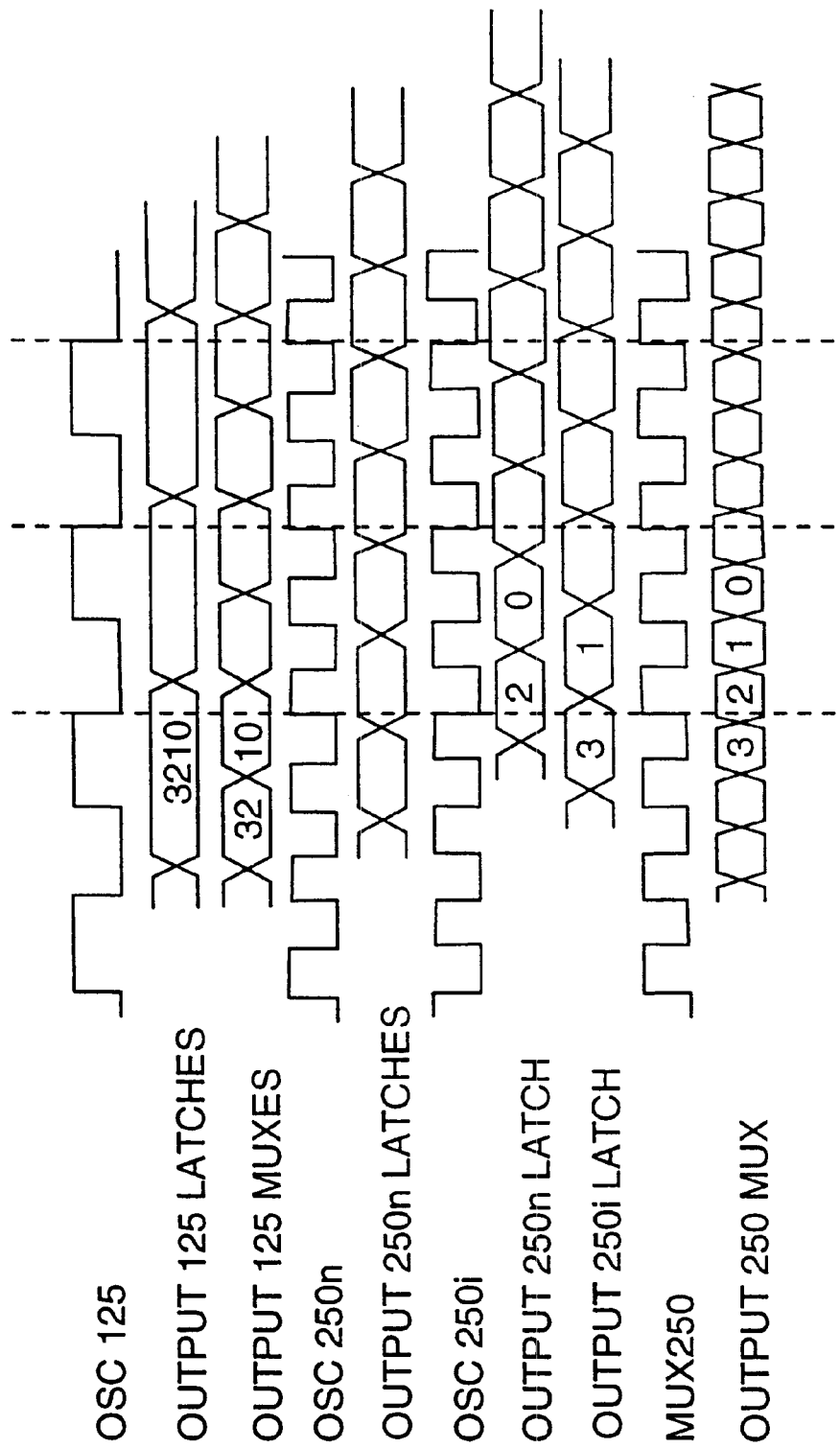
FIG. 2B shows a timing chart for the circuit of FIG. 2A.

FIG. 2B shows a timing diagram for the circuit in FIG. 2A. The first graph in the figure labeled OSC 125 represents the basic clock. The graph labeled Output 125 Latches shows the information which is outputted from latches LT0 through LT3. The number 3210 represents the order in which the bits are outputted from the latches. As can be seen from FIG. 2A, the bits are labeled DATAIN0, DATAIN1, DATAIN2 and DATAIN3. The output is in the order, 3-2-1-0. The graph labeled Output 125 MUXes represents the output from MUXA and MUXB. The order of the bits are 3-2 and 1-0. The graph labeled OSC 250N represents the 250 nanosecond clock. The graph labeled Output 250N Latches represents output from Latch 4 and Latch 5. The bits are outputted in the order 3-2 and 1-0. The graph labeled 0S2 50i is an inverted 250 nanosecond clock. This clock is used to drive L6. Therefore, the graph labeled Output 250N Latch represents the output from Latch 7. The graph labeled Output 250i Latch is an output from latch L6. It can be seen that bits 2 and 0 are outputted from L7; whereas, bits 3 and 1 are outputted from L6. The graph labeled MUX 250 represents the clock driving a MUXC. The graph labeled output 250 MUX represents the output from MUXC labeled in FIG. 2A as Data Out. As is evident from FIG. 2B, the bits are outputted in the order 3-2-1-0. As stated previously, this output data is driven by the driver DR1 previously discussed above.

Figure 3:
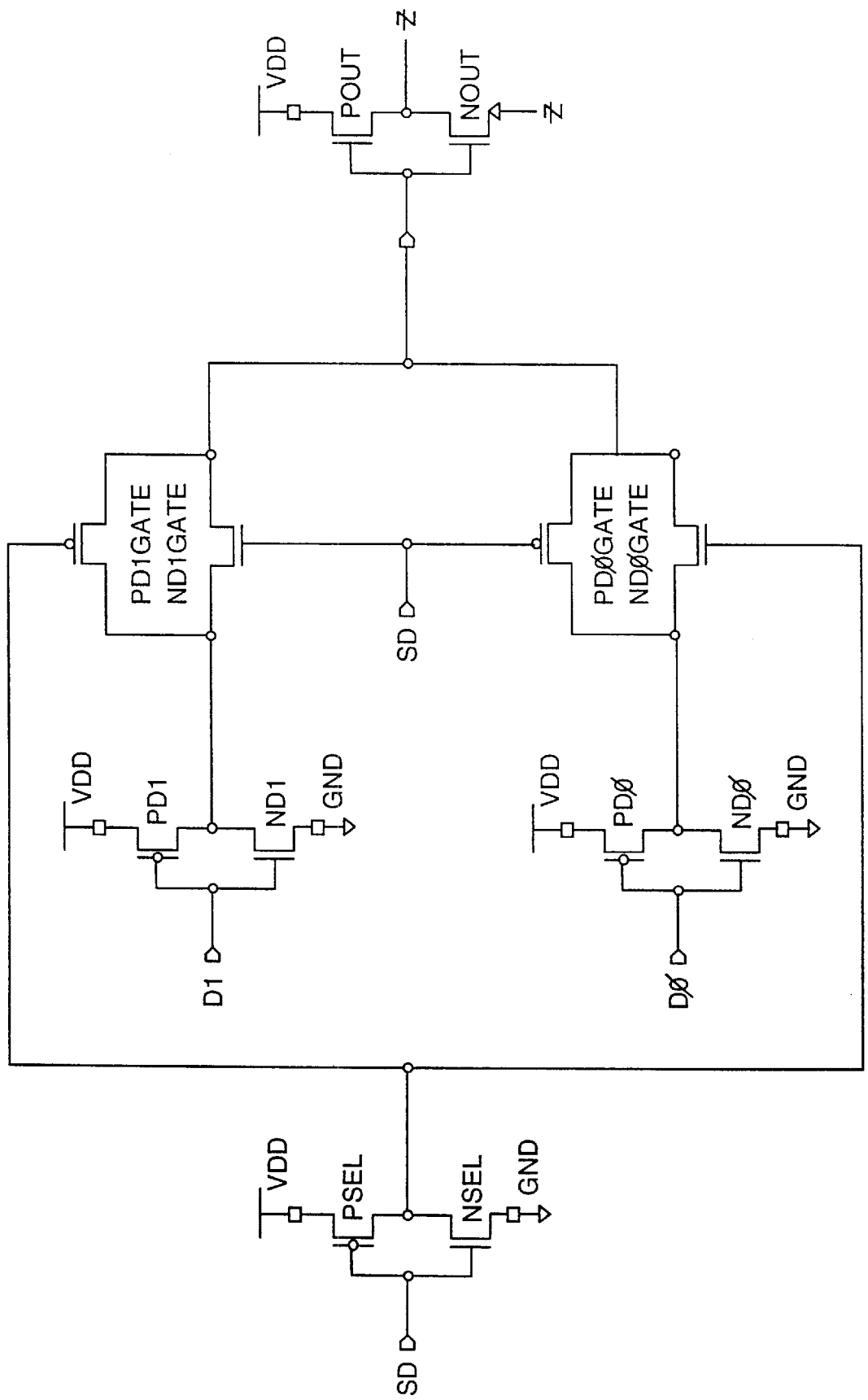
FIG. 3 shows a circuit diagram of the multiplexer.
Figure 6:
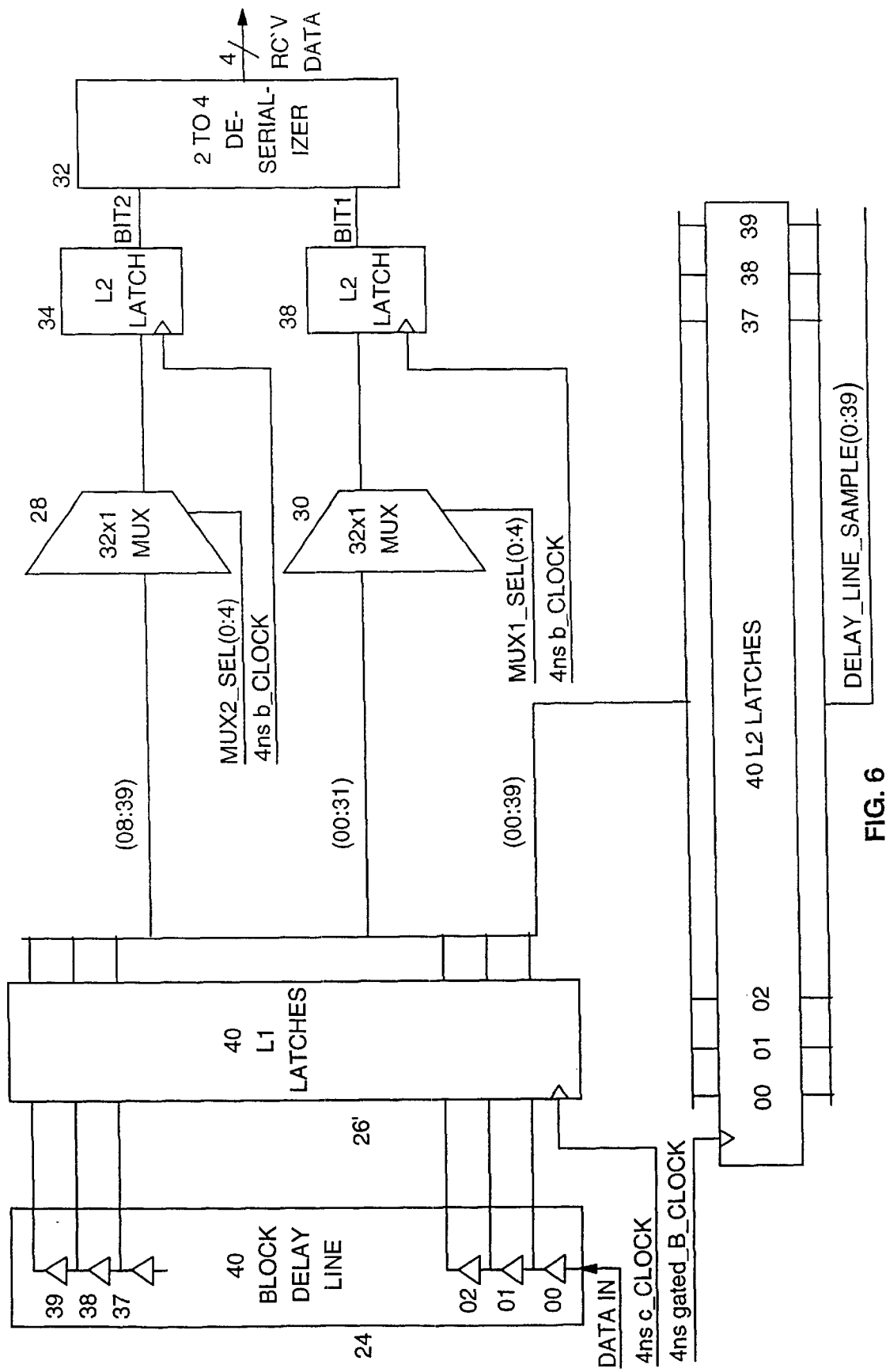
FIG. 6 shows a block diagram of the deserializing circuit.

FIG. 3 shows a 2 to 1 multiplexer circuit. The 2 to 1 multiplexer (MUX) circuit is a basic building block which can be connected with other 2 to 1 circuits to provide the 4 to 1 Multiplexer Circuit 22 (FIG. 1) or 32 to 1 MUX (FIG. 6). Such interconnection is within the skill of one skilled in the art and further details of interconnection will not be given. Still referring to FIG. 3, inputs are D0 and D1. The output is labelled Z. The control is furnished by Control Input SD. Transistors P select and N select are configured as an inverter that inverts the control input signal SD. Similarly, Transistor PD1 and ND1 are inverters that invert the signal D1. Transistor PD0 and ND0 are connected as inverters to invert the signal D0. Both inverters provide inversion and buffering for their respective inputs, D0 and D1. Transistors PD0 gate and ND0 gate, PD1 gate and ND1 gate act as transmission gate past for these signals to the output Z. In operation, the select signal SD turns on either the gate pass for D0 or D1. This is supplied to the output through inverter/buffer comprising of Transistors POUT and NOUT.

Figure 4:
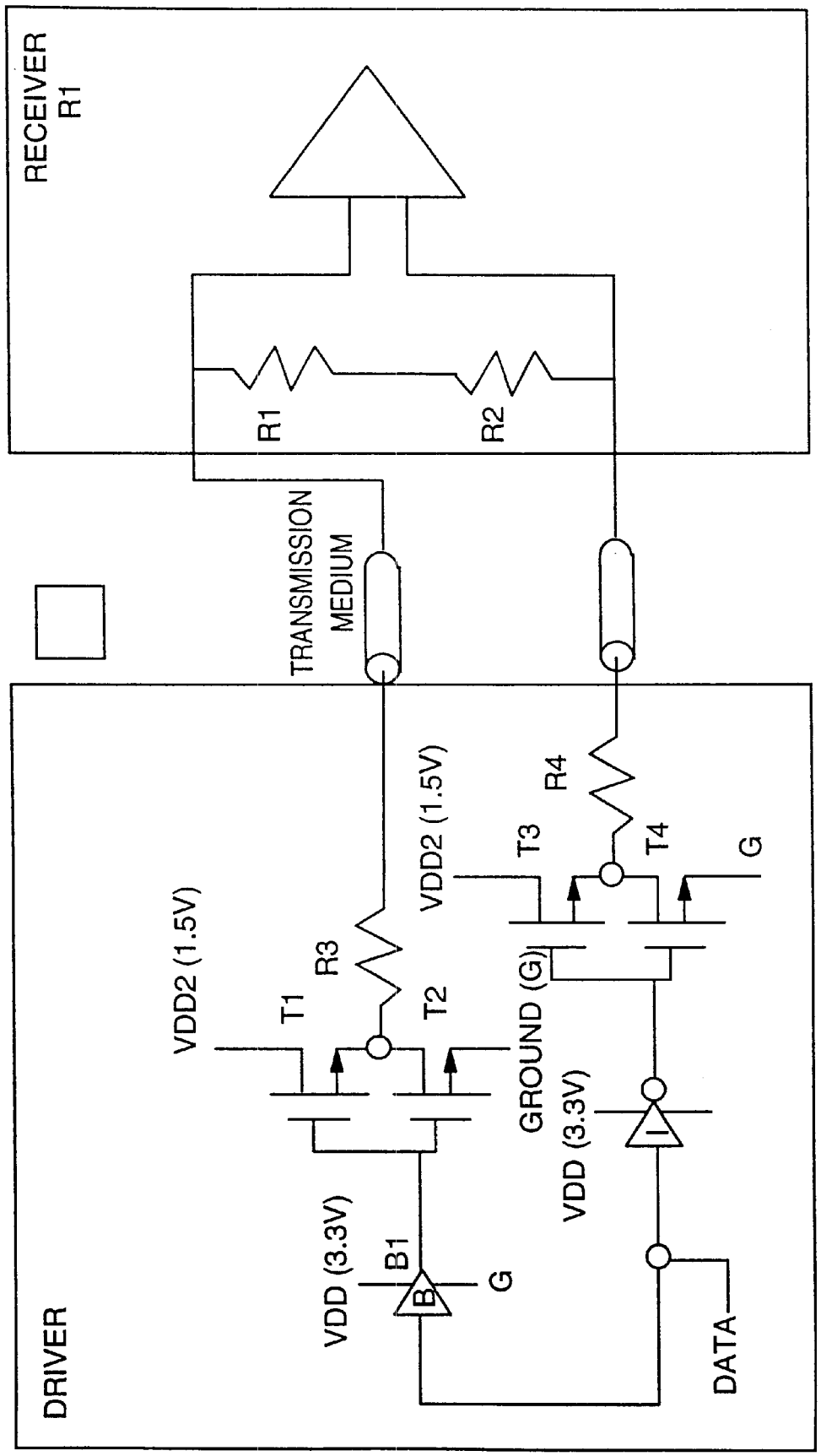
FIG. 4 shows a circuit diagram of the differential driver.

FIG. 4 shows a circuit diagram for a low power driver. The driver is attached by transmission medium to the receiver R1. As discussed above, the receiver R1 is associated with one of the modules and the driver is associated with the other module. For purposes of description, it is assumed that two modules are interconnected. Of course, any number of modules could be connected without departing from the scope and spirit of the present invention. The driver includes inverter 11 coupled to transistors T3 and T4. Resistor R4 couples the output of transistors T3 and T4 to the transmission medium. Buffer B1 has an input connected to the input data line and output connected to transistors T1 and T2. A resistor R3 connects the output of transistors T1 and T2 to transmission medium. In operation, data signals drive inverter 11 and buffer B1. Transistors T1 through T4 switch on and off accordingly to create the differential output voltage. Since a driver is designed to drive into a transmission medium, the source impedance is made to be matched to the transmission lines characteristic impedance—typically 50 Ohms. To accomplish this, the combination of switch impedance of T1 through T4 and series resistance R3, R4 are adjusted to 50 Ohms. The tradeoffs for this has to do with initial and temperature tolerances of switch devices, size of devices, and an acceptable amount of shoot-through down T1, T2 (T3, T4) during the switching transition. The circuit uses a source follower with a nominal impedance of 10 Ohms (T1, T3) of the bottom devices T2, T4 in the output power stage are also 10 Ohms. Resistors R3, R4 are set to 40 Ohms. FIG. 4 also shows resistors R1 and R2 which are set to 50 Ohms and act as the drivers load. It should be noted that the drivers load is in the receiver section of the system. Values are set to match the transmission lines' characteristics impedance. Matched impedance eliminates or minimizes transmission line reflections, maximizing the integrity of the signal at the receiver input. This is particularly important when data is not encoded, in that the frequency content of the signal sent as a large spectral bandwidth and cannot be tuned or adjusted to pass a limited frequency signal.

Current drawn by the driver is roughly 7.5 milliampere. Wattage drawn from the 1.5 volts supplied is 11.3 Mwatts, half of the power drawn from the more conventional driver having the same level of differential output swing as its driver. Additional wattage is incurred in either scheme due to driving on and off the capacitance of the transistors T1 through T4 to ground. Or in the case of the low power driver, current sent at the time of transition shoots through series devices T1, T2 (T3, T4). This can be minimized by using smaller devices and by increasing the device resistance of switches T1 through T4 into the range of 10 Ohms as mentioned above. This will limit additional wattage due to the transition to an additional 2 to 3 milliwatts. This circuit is particularly importance for a switch application where 64 drivers are needed. The savings is approximately 2 watts/ switch. The savings will mean financial savings for the switch module package, the box cooling and the size/cost of the power supply.

Figure 5:
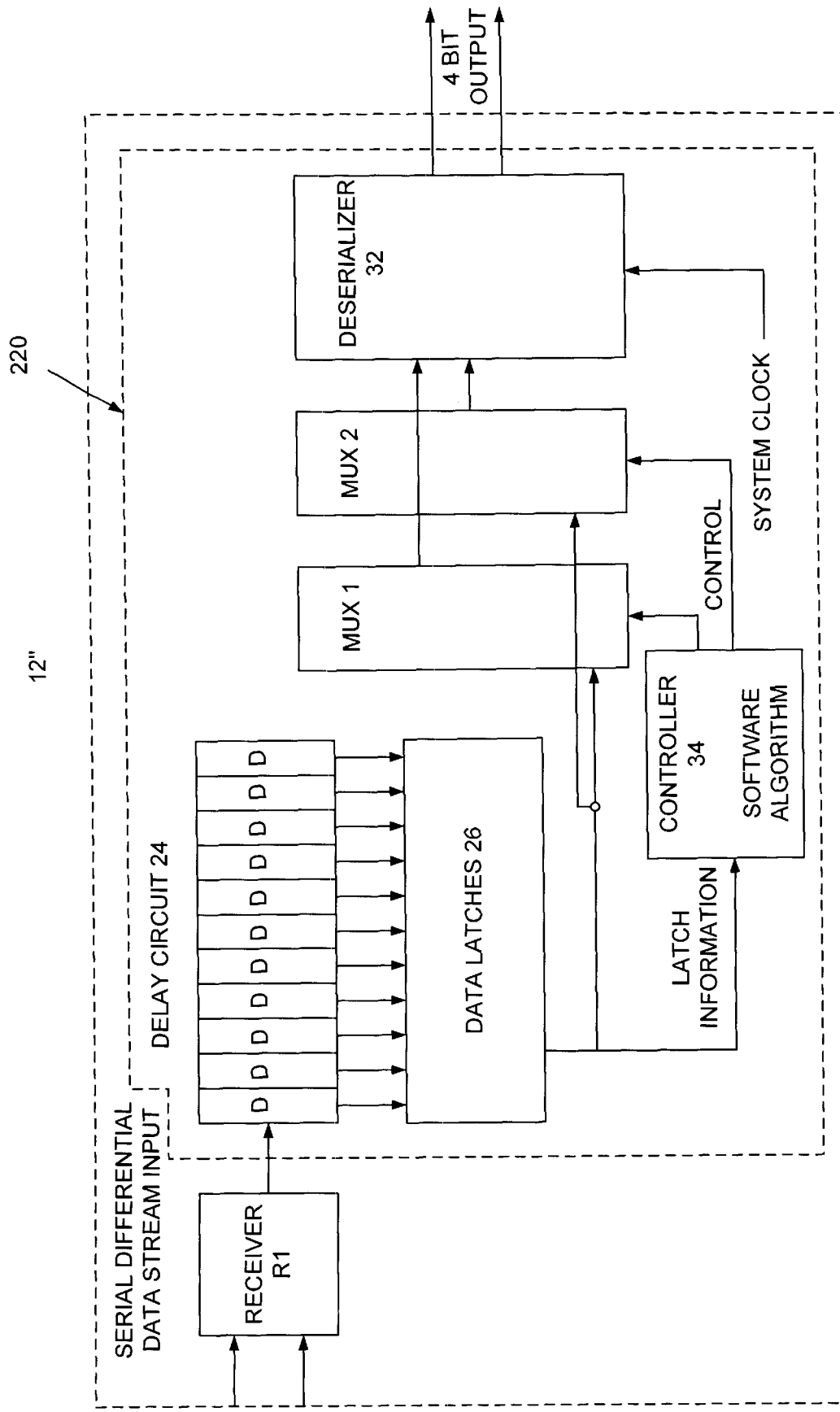
FIG. 5 shows a block diagram of the receive section (Receiver) of the DASL interface.

FIG. 5 shows a block diagram of the Receiving Section 12"" of the DASL interface. The Receiving section includes a receiver R1 and a bit synchronizing and nibbles synchronizing Section 220. The receiver R1 receives the serial differential data stream from the transmission line, converts it back to logic levels, and forwards the serial data to the bit synchronize and nibble synchronize Section 220.

Figure 11:
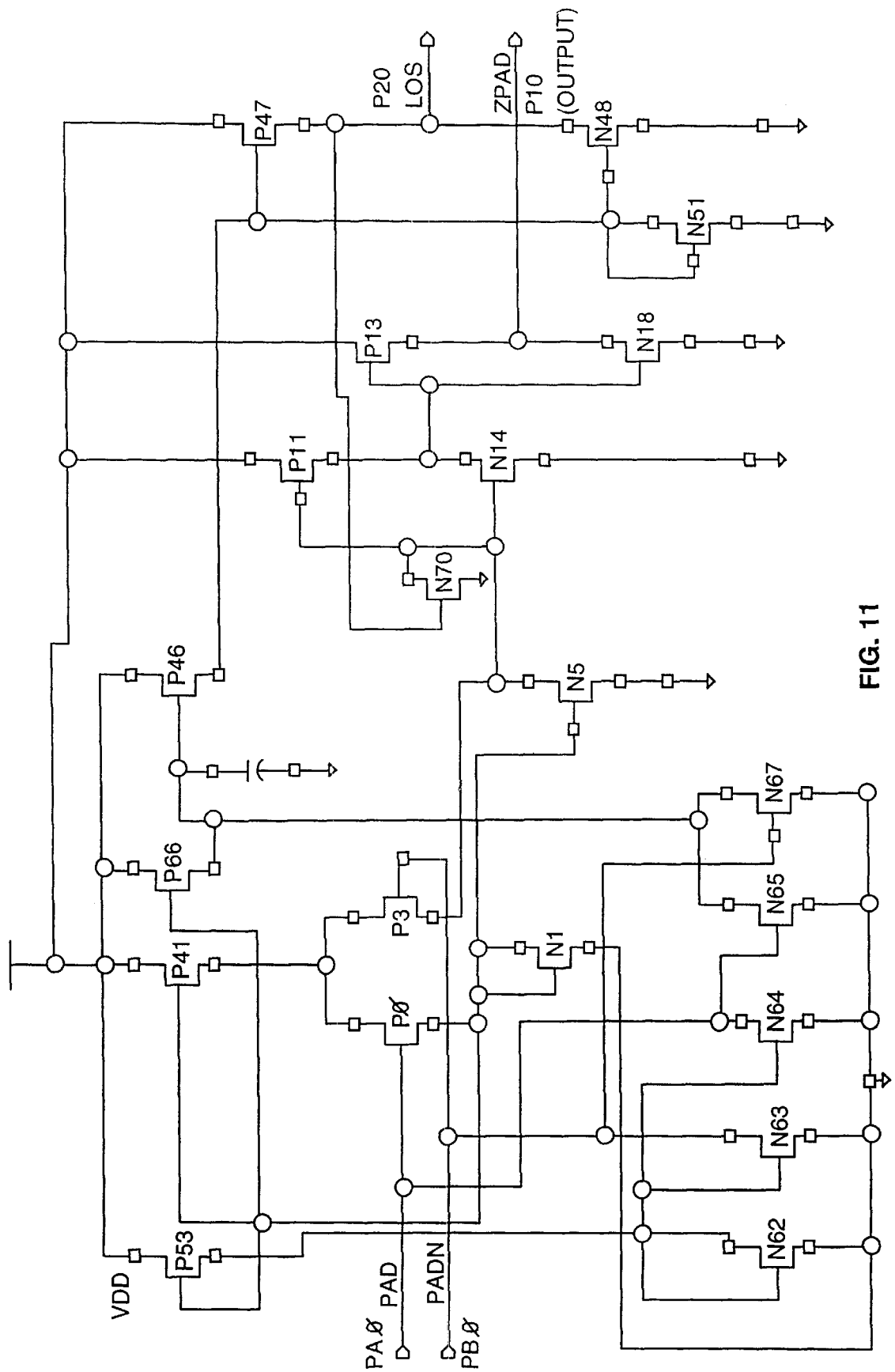
FIG. 11 shows a circuit diagram of the receiver circuit.

FIG. 11 shows a circuit diagram of Receiver R1. As stated previously, the incoming signals are differential, with typical voltage swings of about 0.5V peak-to-peak and a common mode voltage of about half of the power supplied voltage (0.75V). The differential signal is fed to P-channel transistors P0, P3 which are set up as the differential amplifier with a common source current established by transistors P41 and N-channel transistor N1. Arranging the devices as shown creates a self-biasing differential input that adjusts to the common mode voltage of the differential input signal. The amplified input signal is then fed to transistors P11 and N14 which further amplify the input signal and convert it from a differential signal to a single-ended rail-to-rail signal. To further buffer the signal, another stage of amplification is added using transistors P13 and N18. This allows the receiver the ability to drive a larger output load than would be realized without this final stage. This is important at high speeds in that minimal signal distortion is realized with the proper amount of drive to logic loads in the next stage of signal processing. The receiver also contains circuitry to detect whether or not the input to the receiver is, in fact, connected to a driver. In application, the possibility exists that the driver to the receiver has been either disconnected or not powered. To prevent the amplification of system noise to the next stage of the receiver, transistors N62 through N65, N67, P53, P66, P46, P47, and N51, N48 are configured to detect the absence of an input and so indicates this absence to the next stage of the serial link through the loss of signal (LOSS) output.

Referring again to FIG. 5, the bit synchronization and nibble subsystem 22 includes Delay Circuit 24. The Delay Circuit 24 includes a plurality of delay elements or storage numbered D1 through D40. The output from each delay element is fed into a Data latch in Data Latches 26. In the preferred embodiment of this invention, the well-known LSSD logic design structure is used. In this logic design structure, the data latches are of two types known as L1 latches and L2 latches. The output from the L1 latches are fed into multiplexers (MUX1 and, MUX2). The outputs from the multiplexer are fed into L2 latches and then Deserializer 32 from which a 4-bit output signal is fed into a buffer (not shown) from which the nibble, which was transmitted from the transmitter section of the interface, is recaptured. A system clock is also fed into Deserializer 32. The latch information from the L2 latches (not shown) are fed into Controller 34. The Controller 34 could be a program processor running a specialized software algorithm which parses the data received to detect edges and, hence, the location of at least two bits received in the system. As soon as the edges are determined, control signals are outputted on the control line to set the MUX1 and 2 to pass data from selected members of the latch.

FIG. 6 shows a circuit diagram for the bit synchronization and nibble synchronization Circuit 22 (FIG. 5). To simplify the discussion, elements in FIG. 6 that are common with elements in FIG. 5 are labelled with the same numerals. The system includes a 40 element delay line circuit 24. The delay line includes elements 00 through 39. The output from each stage of the delay line is connected to a latch in a set of 40 L1 latches labelled 26'. A gated 4 NSC clock is also coupled to the data latches 26'. Bits 08 through 39 of the L1 latches are connected to a 32 by 1 MUX28. A control signal labelled MUX2 is also connected to MUX28. As will be described subsequently, this control signal is generated by a microprocessor executing a program or from a state machine. The output from MUX28 is fed into L2 latch 34. A line labelled Bit 2 is outputted from latch 34 and is fed into a 2 to 4 deserializer 32. The bit on the line represents one of the bits captured in the delay line. Four data bits are outputted on a bus labelled RCV DATA. As will be explained subsequently, these four bits are used to detect the nibble which was transmitted from the transmitter portion of the interface.

Still referring to FIG. 6, Bits 00 through 31 of the 40 L1 latches are fed into 32 by 1 MUX30. A control signal labelled MUX1 is provided to the MUX30. The control signal, when activated, informs the MUX which one of the latched data should be passed. This control signal is generated by a program running in a processor or from state machine logic (to be discussed hereinafter). The output from MUX30 is fed into L2 Latch 38. The output from L2 Latch 38 is labelled Bit 1 and is fed into Deserializer 32. The bit on the line labelled Bit 1 represents the other bit captured in the delay line. With two bits captured, the four bit nibble can be easily generated. A four nanosecond B clock is also provided to L2 Latch 34 and L2 Latch 38. Bits 0 through 39 of the 40 L1 latches are also fed into 40 L2 latches. A four nanosecond gated B clock is also fed into the 40 L2 latches. The output from the 40 L2 latches are used by Controller 34 to find edges within the input signal.

Figure 7:
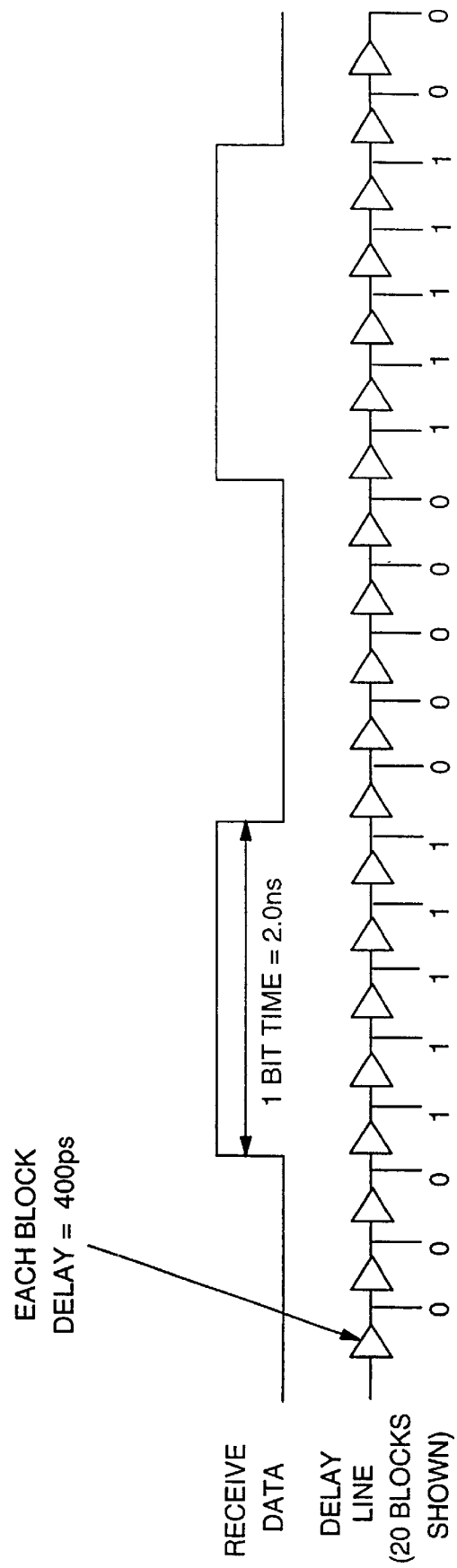
FIG. 7 is a graphical representation of data as it would appear in the delay line.

FIG. 7 shows a graphical representation of data as it would appear in the delay line. In the figure, only 20 delay blocks are shown. Block delay can vary between 133 ps to 400 ps, depending on process, temperature, and voltage. The bit time is considered a constant between 2.0 ns and 2.5 ns, depending on the application.

As stated previously, in order to synchronize the receiver portion of the interface to the data, a pre-processing routine of bits received from the interface is required. Table 1 shows a graphical representation of the bits as received and processed to derive the delay line sample mask which is parsed to detect the edges from which two bits are deduced. In the table, line 1 represents the delay line sample captured from the delay lines. Line 2 represents the bit edge mask which is formed from each delay line bit Exclusive (X) OR'd with itself shift left one position. It is the delay line sample mask data that is used to determine the edges that are used to synchronize the receiver with the data. Stated another way, the settings for MUX1 and MUX2, FIG. 6, are calculated from the delay line sample mask.

TABLE I

| NAME | PATTERN | |
|---|---|---|
| Delay Line Sample | 000111110000011111000001111100000111100 | |
| Delay Line Sample Mask | 001000010000100001000010000100001000010 | 5 |

The algorithm or state machine which parses the delay line sample mask will now be described. The keys for understanding the flowchart are set forth in Tables II through Table VI. For example, Table II identifies transition control signals on the flowchart. Likewise, Table IV identifies input signals and so forth.

TABLE II

Transition Control

A. if Edge Detect Sample (0 to 3), "1100" or "1110"
B. if Edge Detect Sample (0 to 3) = "0000" or "0001" or "0011" or "0100" or "0111" or "1000" or "1001"
C. if Edge Detect Sample (0 to 3) = "0101" or "0110" or "1010" or "1011" or 1101" or "1111"
D. if not (Transition Control E) and not (Transition Control F)
E. if Edge Detect Sample (Shift Count) = "0"
F. if Edge Detect Sample (Shift Count to Shift Count +2) = "111"
G. if Edge Detect Sample (Shift Count to Shift Count +3) = "0000" or "1100"
H. if not (Transition Control G)
I. if Find Edge 1 = true
J. if Find Edge 1 = False
K. if not (Transition Control L) and not (Transition Control M)
L. if Period 2 = 0
M. if not (Transition Control L) and Edge Detect Sample (Shift Count) = "1"

TABLE III

Signal Updates by Decision Block

Only signals which are updated by the decision block are listed. All signals are cleared by reset. Signals are updated after the block decision is made.

1. Idle
Bad Sample = false, Complete = true,
2. Load
Complete = false, Shift Count = 0
3. X
Shift Count = Shift Count + 1, Period 1 = Period 1 + 1, Period 2 = Period 2 − 1, Find Edge 1 = True
4. I0
Shift Count = Shift Count + 1, Period 1 = Period 1 + 1, Period 2 = Period 2 − 1
5. I1
Shift Count = Shift Count + 1, Period 1 = Period 1 + 1, Period 2 = Period 2 − 1
6. X0
Shift Count = Shift Count + 1, Period 1 = Period 1 + 1, Period 2 = Period 2 − 1
7. X00
Shift Count = Shift Count + 1, Period 1 = Period 1 + 1, Period 2 = Period 2 − 1
8. X000
Shift Count = Shift Count + 1, Period 1 = Period 1 + 1, Period 2 = Period 2 − 1
9. X0000
Shift Count = Shift Count + 1, Period 1 = Period 1 + 1, Period 2 = Period 2 − 1
10. X00000
Shift Count = Shift Count + 1, Period 1 = Period 1 + 1, Period 2 = Period 2 − 1
11. X00000
Shift Count = Shift Count + 1, Period 1 = Period 1 + 1, Period 2 = Period 2 − 1
12. X000000
Shift Count = Shift Count + 1, Period 1 = Period 1 + 1, Period 2 = Period 2 − 1
13. X0000000
Shift Count = Shift Count + 1, Period 1 = Period 1 + 1, Period 2 = Period 2 − 1
14. X00000000
Shift Count = Shift Count + 1, Period 1 = Period 1 + 1, Period 2 = Period 2 − 1
15. X000000000
Shift Count = Shift Count + 1, Period 1 = Period 1 + 1, Period 2 = Period 2 − 1
16. X0000000000
Shift Count = Shift Count + 1, Period 1 = Period 1 + 1, Period 2 = Period 2 − 1
17. X00000000000
Shift Count = Shift Count + 1, Period 1 = Period 1 + 1, Period 2 = Period 2 − 1
18. X0000000000000
Shift Count = Shift Count + 1, Period 1 = Period 1 + 1, Period 2 = Period 2 − 1
19. X00000000000000

TABLE III-continued

Signal Updates by Decision Block

Only signals which are updated by the decision block are listed. All signals are cleared by reset. Signals are updated after the block decision is made.

Shift Count = Shift Count + 1, Period 1 = Period 1 + 1, Period 2 = Period 2 − 1
20. XI
if Find Edge 1 = true then Initial Edge 1 = Shift Count (prior to update), if Find Edge 1 = False then Initial Edge 2 = Shift Count 2 = Shift Count (prior to update), Shift Count = Shift Count + 1, Period 1 = Period 1 + 1, Period 2 = ½ (Period 1 (prior to update))
21. Valid Edge
Shift Count = Shift Count + 1, Period 1 = 2, Period 2 = Period 2 − 1, Find Edge 1 = false
22. Valid Edge W1
Shift Count = Shift Count + 1, Period 1 = Period 1 + 1, Period 2 = Period 2 − 1
23. Valid Edge W2
Shift Count = Shift Count + 1, Period 1 = Period 1 + 1, Period 2 = Period 2 − 1
24. Find Edge 3
Shift Count = Shift Count + 1, Period 1 = Period 1 + 1, Period 2 = Period 2 − 1
25. Error
Shift Count = Shift Count + 1, Period 1 = Period 1 + 1, Period 2 = Period 2 − 1, Bad Sample = True

TABLE IV

INPUT SIGNALS

1. Reset
2. Sync Request
3. Request
4. Edge Detect Sample (0:38)

TABLE V

Output Signals

1. Initial Edge 1
2. Initial Edge 2
3. Bad Sample
4. Complete

TABLE VI

Internal Control Signals

1. Shift Count
2. Period 1
3. Period 2
4. Find Edge 1

Figure 9:
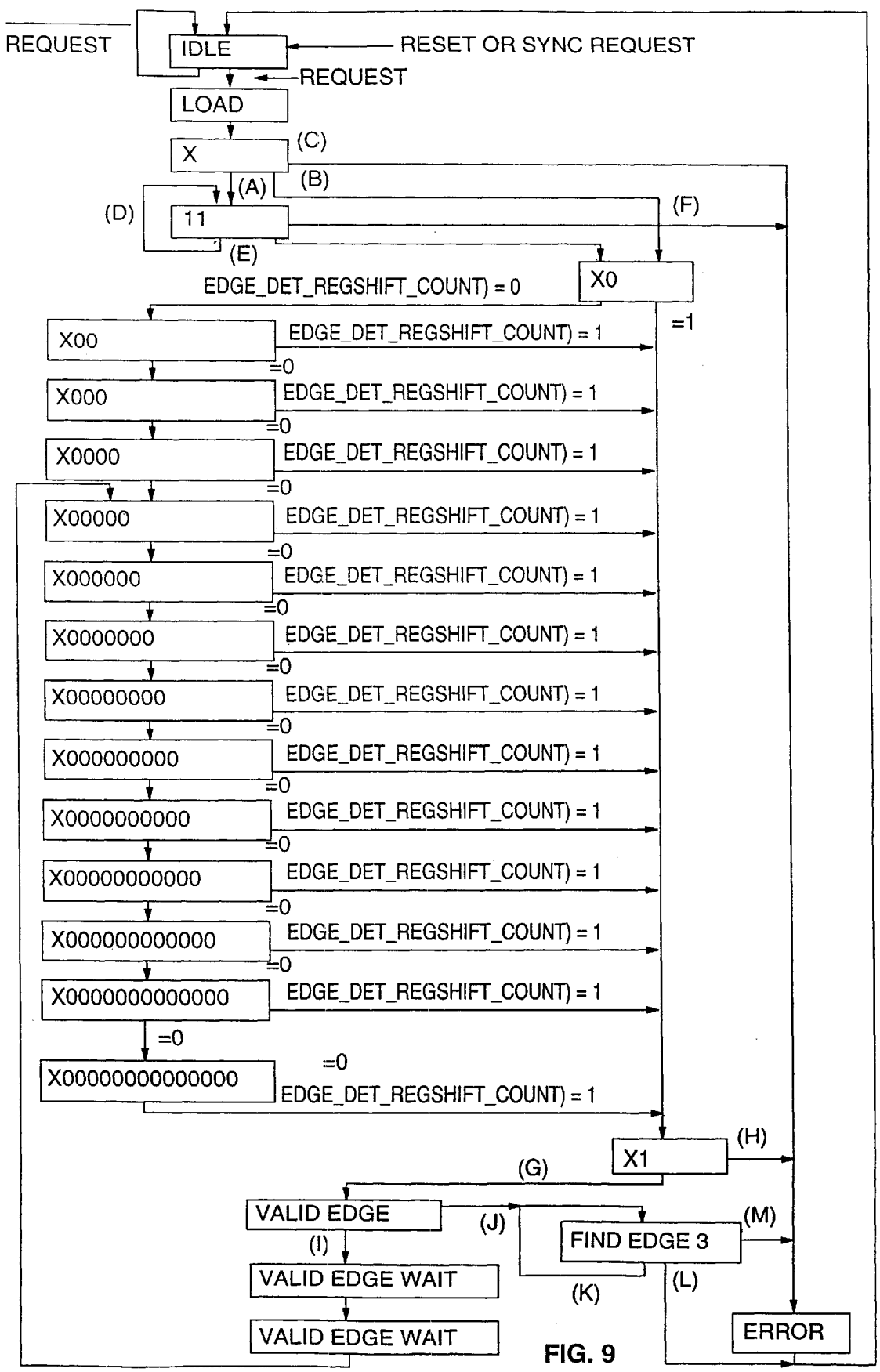
FIG. 9 is a state machine that initializes the Receiver to receive data.

FIG. 9 shows a flowchart of the initialization algorithm. The first block in the flowchart is labelled Idle. In this block, the algorithm is at rest and nothing happens. If there is no request ($\overline{\text{REQUEST}}$), the program loops on that block. When there is a reset request or a sync request, the program moves to the block labelled Idle. When there is a request, the program moves to the block labelled Load. In the Load block, the information which is in the 40 L2 latches, FIG. 6, is loaded in the processor memory. Upon completion of the loading routine, the program enters the block labelled X. The program can exit through Paths A, B or C from the X block. It should be noted that in Block X, the program sets the boundary conditions set forth in Table III.

If the program traverses Path A into Block H, the pattern set forth in the Table II is observed. If the program exits along Path B, the pattern identified with B in Table II is observed. If the program exits along Path C, the pattern set forth with C in Table II is observed. If the program exits along Path C into the Error Block, this signifies an error condition in which the program loops and restarts the process. If the program exits along Path B, it enters the block labelled X0. In Block X0, it performs the function set forth under item 6, Table III. If the value calculated in X0 is a 1, this signifies that Initial Edge 1 is found (see Table IV). The program would then descend into the block labelled X1. In X1, the function performed is listed under item 20 of Table II. From Block X1, the program can exit along G or H. The function which is associated with G and H is set forth under the name letters in Table II. If the program exits along H, it enters the error block and the process is repeated as described above.

Still referring to FIG. 9, if the edge detect register shift count is equal to 0 exiting out of X0, then by a similar manner, the program shifts to the left as is shown in each block and the associated action which is indicated is performed. By following each step with the Tables listing the condition, one can determine how the program works.

Having determined Edge 1 and Edge 2 from the above algorithm, a third Edge 3 is detected. Since the training pattern contains two segments with missing transitions, a third edge is found. By comparing the width of the bit bracketed by edge 1 and edge 2 with the width of the bit bracketed by edge 2 and edge 3, it can be determined whether edge 1 and edge 2 bracket a single bit or whether they bracket two adjacent bits from a segment containing a missing transition.

In addition to detecting Edge 1 and Edge 2, the spacing, also called period, between Edge 1 and Edge 2 is determined. The sample point which is midpoint 1 and midpoint 2 is then calculated from the following equations:

$$\text{Midbit 1 is equal to Edge 1} + 0.5 \text{ (Edge 2−Edge 1).} \qquad \text{EQ1:}$$

$$\text{Midbit 2 is equal to Edge 2} + 0.5 \text{ (Edge 2−Edge 1)}−8. \qquad \text{EQ2:}$$

It should be noted that in EQ2, 8 is subtracted because MUX28 carries bits 8 through 39 (FIG. 6). It should also be noted that the control line MUX2, FIG. 6, equals Midbit 2. Similarly, control line MUX1 equals Midbit 1. Stated another way, once these values are determined, they are used for setting the MUX30 and MUX28 and only the contents of latches that have a value corresponding to these set values will be allowed to pass through MUX28 and MUX30 into L2 Latch 38 and L2 Latch 34. The output from Latch 38 becomes Bit 1, while the output from L2 Latch 34 becomes Bit 2. The two bits are used to generate the nibble (4 bits) that were transmitted originally.

Once the calculation has been made, the receiver section is now synchronized with the data coming in and the synchronization of the nibble will now be performed. Before describing the synchronization of the nibble, the operation of the system to bit synchronization will now be given.

During initialization, and prior to sending actual data, a training (initialization) pattern is sent and received by receiver R1. The training pattern is a 32 bit transition rich sequence of 7 hex "A" patterns (1010), and 1, hex "5" pattern (0101). The purpose of this training pattern is to provide sufficient pattern edges so as the receiver, through its algorithm, can acquire bit synchronization and then nibble synchronization to establish the most and least significant bit in the serial data stream when the bit stream is converted back to a 4 bit nibble.

To perform bit alignment, the received data is fed into a series of delay blocks D1 through D40, where the delayed data is oversampled and latched by latches L1 through L40. The captured oversampled data is then fed into a controller, which looks at the oversampled data to determine where in the series of latch positions did data transitions occur. This is done to determine two sample points in the stream of oversampled data with the highest probability of uncorrupted data. The oversampled data which has the least probability of data error is the oversampled data contained in the latches farthest away from the data transitions. This is because all high speed systems have data jitter in the form of the system clock jitter, data intersymbol and transmission media distortions as well as system cross talk that make the sample around data transitions uncertain as to data integrity. By averaging the positions determined to have transitioning data, the controller than determines which of the latched data to be used for the serial data samples.

The sample points are selected by taking the locations of the data latches where data transitions occur, subtract the location numbers and add half the difference to the smaller location (done for two sequential data bits, giving two strobe positions). The controller acts as a digital software filter through this process by accumulating and averaging transition information and supplying the result of the accumulated data. This is important in that the best sample point is the point based upon the average points of transition, so as the sample does not respond to one piece of jitter, re-adjust its sample point and then sample the next bit in a location where the data integrity is uncertain. When actual data is sent in place of the training pattern, the sampled data will contain long run lengths where no transitions are present. When this occurs, no update in the algorithm sample point will occur.

The continuous updating by the controller algorithm also adjusts out temperature and initial technology process effects by basing the strobe point on the received data pattern strictly on the ongoing results of processed data input logic edges. As the transition edges move with temperature, so do the sample point. The controller can be time shared in applications having multiple high speed serial links, using only one controller function for all links, to reduce cost.

Once the data stream has been adjusted for the best sample point, the two selected data streams are then fed into a series of latches and passed through two multiplexers (FIG. 6). Access of the output nibble is provided to the controller for adjusting the bits into their proper parallel order. The output nibble bit order is adjusted by the controller through manipulations of the control inputs to MUX1 and MUX2.

Figure 8:
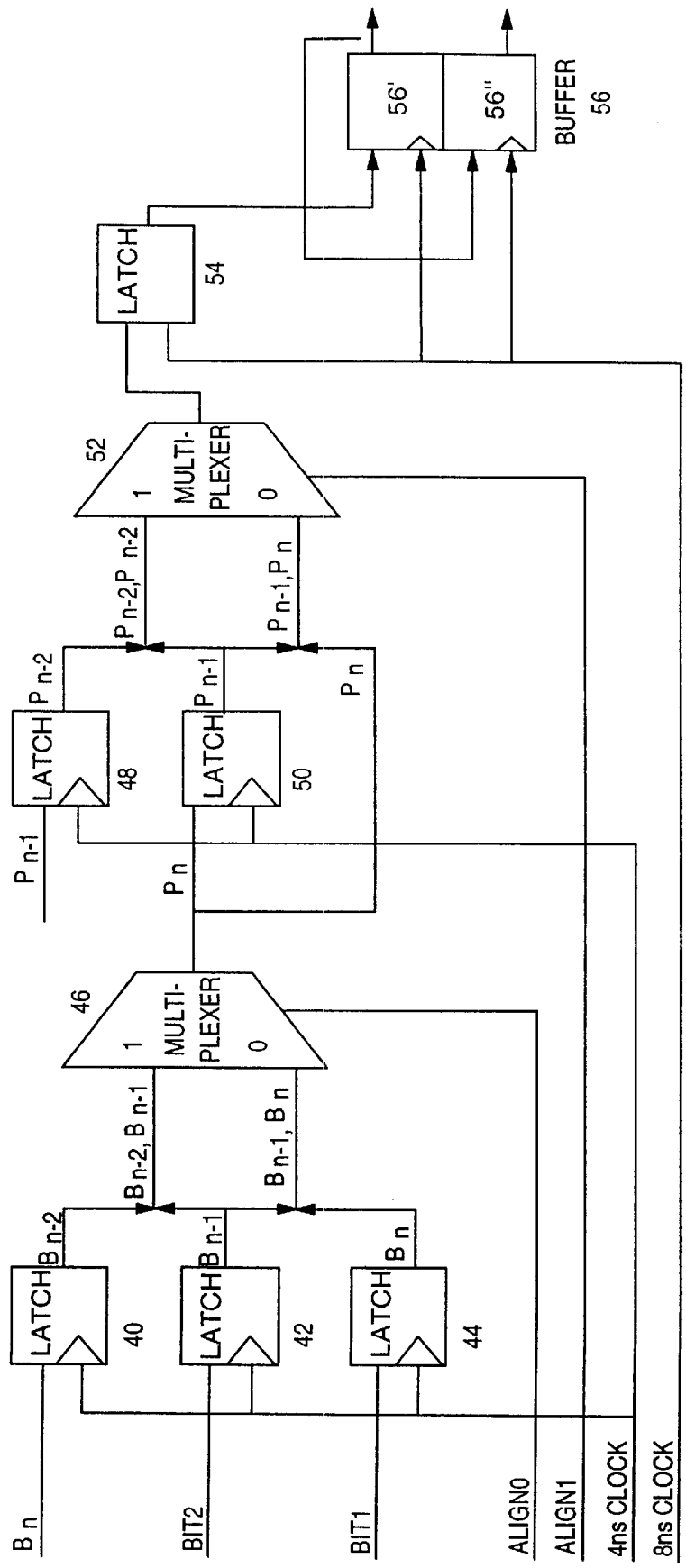
FIG. 8 is a block diagram of the two to four deseralizer and an output latch mechanism.

FIG. 8 shows a circuit diagram for the nibble recovery logic. After the bit recovery has been successfully performed, bits in the serial data stream must be grouped to reconstruct the nibble that was presented to the inputs of the DASL serializing logic. The recovery logic includes latches 40, 42 and 44. The output of the latches labelled $B_n$, $B_{n-1}$ and $B_{n-2}$ are connected to Multiplexer 46. In the preferred embodiment of this invention, Latches 40, 42 and 44 are one bit latches and Multiplexer 46 is a 2 to 1 multiplexer. The bits B1 and B2, which were recovered, are fed into Latch 44 and Latch 42, respectively. A bit, output of latch 44, labelled BN is fed into Latch 40. A four nanosecond clock is connected to Latch 40, 42 and 44. The line labelled Align 0 is a control line into Multiplexer 46. The output from Multiplexer 46 is labelled $P_n$ and is fed into Latch 50 and Multiplexer 52. The output of Latch 50 is also fed into Multiplexer 52. Latch 48 has an input $P_{n-1}$ and output $P_{n-2}$ which is also fed into Multiplexer 52. The four nanosecond clock also gates Latch 48 and Latch 50. A second control line labelled Align 1 is fed into Multiplexer 52. In the preferred embodiment of this invention, Latch 50 is a 2-bit latch and Latch 48 is a 2-bit latch. Multiplexer 52 is a 4-bit multiplexer which selects one of two groups of four bits and feeds them into Latch 54 which is gated by an 8 ns clock. The output from Latch 54 is fed into Buffer 56. The Buffer 56 is an 8-bit buffer with four bits being stored in the section labelled 56' and four bits are stored in the section labelled 56". The signal in section 56' is the immediate output from Latch 54; whereas, the bits in section 56" is the feedback or output from section 56'. As a consequence, the controller can view eight bits at a time in Buffer 56. The control signals Align 0 and Align 1 are driven with different values to shift the data until the correct alignment is observed in Buffer 56. Since a known training pattern is sent during initialization, the controller will read capture data from Buffer 56 to determine if the current nibble alignment is correct. If the alignment is not correct, the data is shifted by modifying the signal on Align 0 and Align 1. As stated previously, the training pattern is comprised of multiple 0 XA characters followed by a single 0 X5 character. The four possible nibble alignments are:

1) A A A A A A A 5
2) 5 5 5 5 5 5 2 D
3) A A A A A A 9 6
4) 5 5 5 5 5 5 4 B

The controller driving Align 0 and Align 1 will start by setting both nibble alignment selects (Align 0 and Align 1) to zero. If the correct training pattern is observed in the Buffer 56, then the initialization is complete. If the correct training pattern is not observed, then the controller will cycle through the remaining nibble alignment select values (01, 10, 11) until the correct training pattern is observed. It should be note that since there are two control lines, the maximum number of alignment values is four set forth above. If all of the nibble alignment select values have been tried and the correct training pattern has not be observed, then the initialization has failed.

Figure 10:
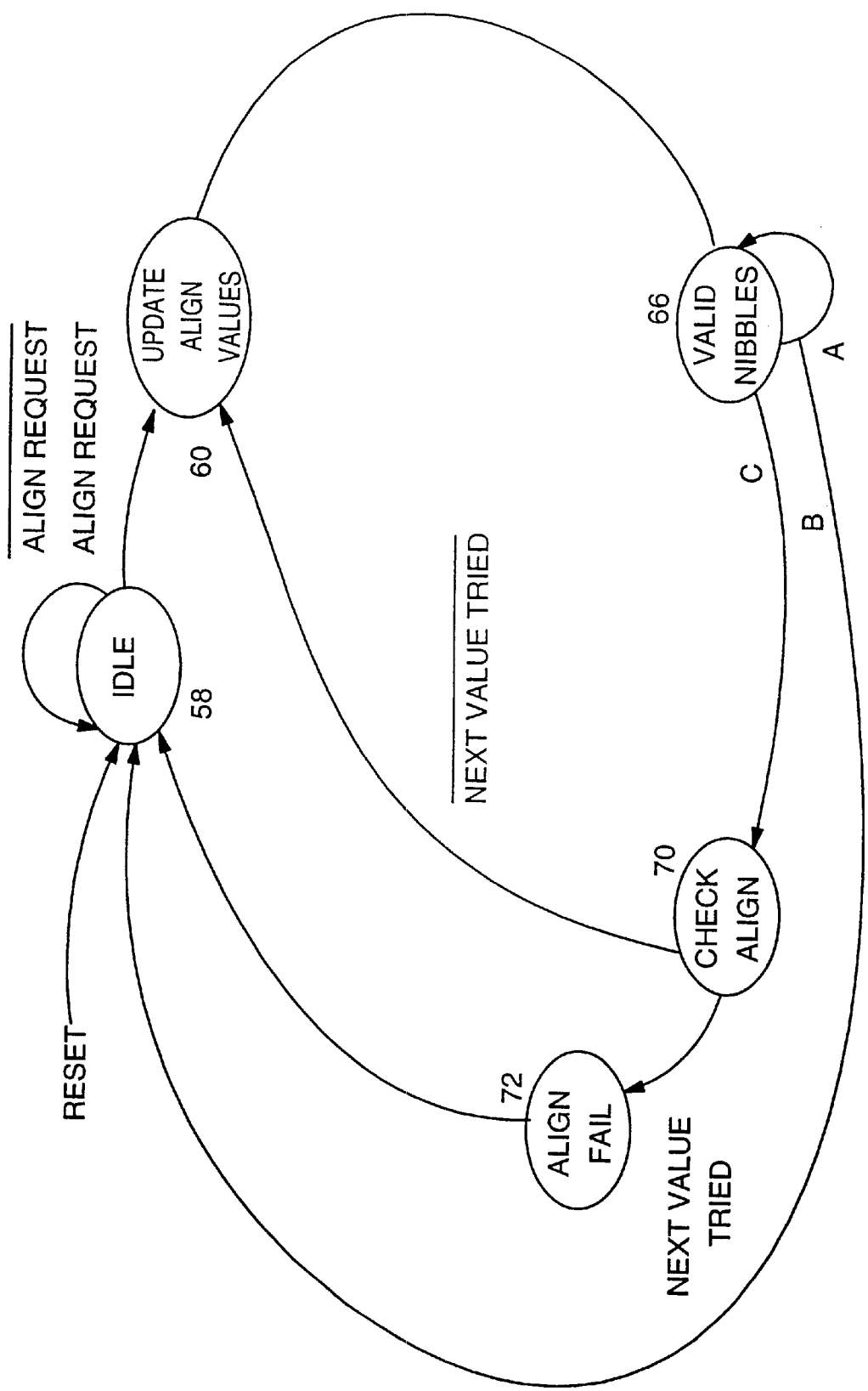
FIG. 10 is a state diagram of the nibble alignment state machine.

FIG. 10 shows the nibble alignment state machine which generates the values on Align 0 and Align 1 control lines (FIG. 8). By using the state machine, one can design a hardware circuit for driving the appropriate values or a software program running in a processor. The state machine has five states labelled 58 through 72. State 58 is an idle state in which the nibble alignment mechanism is inactive. In this state, the mechanism loops on itself until an alignment request is issued in which the state machine moves into State 60.

In State 60, the mechanism writes the alignment selects beginning with Align 0 and Align 1 set to zero. The mechanism then moves to State 66 where it evaluates the contents of Buffer 56 of FIG. 8. If the contents of Buffer 56 is equal to 0×AA, then the mechanism will remain in State 66 (Transition A) and evaluate the contents of Buffer 56 again on the next clock cycle. If the contents of buffer 56 is equal to 0×A5 or 0×5A, the nibble alignment is correct and the mechanism will return to Idle State 58 (Transition B). If the contents of Buffer 56 is not equal to 0×AA, 0×A5 or 0×5A, then the alignment is incorrect and the mechanism will move to State 70 (Transition C). In State 70, the mechanism will check to see if it has tried all combinations of alignment selects (00, 01, 10, and 11). If all of the alignment select values have not been tried, it will select the next value and proceed to State 60 and repeat the sequence described above. If all of the alignment selects have been tried and the correct training pattern has not been recovered, then the initialization attempt has failed.

While the invention has been described with respect to a specific embodiment, it will be obvious to those skilled in this art that changes in both form and/or details may be made therein without departing from the scope and/or spirit of the invention.

Having thus described our invention, what we claim is as follows:

1. A system for converting a serial data input stream into a parallel data output stream comprising:
    a receiver that receives a differential signal which is processed and provided as a single ended signal at a predetermined voltage level;
    a plurality of delay elements that receives the single ended signal;
    a plurality of latches, one of each operatively coupled to one of the plurality of delay elements;
    a controller programmed to parse information in the plurality of latches and to provide a first set of control signals representative of bit position detected from said information; and
    a first logic recover circuit arrangement operatively coupled to the plurality of latches and responsive to the control signals to capture at least two bits from the delay elements.

2. The system of claim 1 further including a second logic recovery circuit arrangement, responsive to a second set of control signals, and operable to use the two bits to reconstruct a group of parallel bits with a predetermined pattern.

3. The system of claim 2 further including a hardware state machine that generates the control signals.

4. The system of claim 1 wherein the first logic recovery circuit arrangement includes
    a first multiplexer circuit (MUX);
    a second multiplexer circuit (MUX);
    a first bus for feeding a predetermined number of bits from the plurality of latches into the first multiplexer;
    a second bus for feeding a predetermined number of bits from the plurality of latches into the second multiplexer;
    a first latch operatively coupled to the first multiplexer; and
    a second latch operatively coupled to the second multiplexer.

5. The system of claim 2, wherein the second logic recovery circuit arrangement includes:
    a first set of parallel arranged latches with outputs coupled to a first common node and common inputs coupled to a clocked signal line and dedicated inputs coupled to a dedicated bit line;
    a first multiplexer having an output, said first multiplexer coupled to the first common node and a control signal line;
    a first latch having a gated input, a dedicated input and an output coupled to a second common node;
    a second latch having a gated input, a dedicated input coupled to the output of the first multiplexer and an output coupled to the second common node;
    a second multiplexer having an input bus coupled to the second common node and an output bus; and
    an output latch having a gated input, a second input coupled to the output bus of the second multiplexer and an output bus.

6. The system of claim 5 further including a buffer operatively coupled to the output bus of the output latch.

* * * * *